United States Patent [19]

Landecker

[11] 4,101,342

[45] Jul. 18, 1978

[54] THERMOELECTRIC ELEMENT

[76] Inventor: Kurt Landecker, 157 Marsh St., Armidale, New South Wales, Australia, 2351

[21] Appl. No.: 723,890

[22] Filed: Sep. 16, 1976

[30] Foreign Application Priority Data

Oct. 7, 1975 [AU] Australia .............................. 3466/75

[51] Int. Cl.² ............................................. H01V 1/02
[52] U.S. Cl. ..................................... 136/228; 136/203; 136/227; 73/359 R
[58] Field of Search ....................... 136/203, 227, 228; 73/359; 29/573

[56] References Cited

U.S. PATENT DOCUMENTS

| 3,022,360 | 2/1962 | Pietsch | 136/203 |
| 3,211,587 | 10/1965 | McCoy et al. | 136/228 |
| 3,224,206 | 12/1965 | Sizelove | 136/203 |

FOREIGN PATENT DOCUMENTS

| 182,778 | 9/1966 | U.S.S.R. | 136/203 |

*Primary Examiner*—Nelson Moskowitz
*Attorney, Agent, or Firm*—Weingarten, Maxham & Schurgin

[57] ABSTRACT

A thermoelectric element having two annular components of dissimilar thermoelectric materials and a working junction therebetween and providing radial current flow.

6 Claims, 6 Drawing Figures

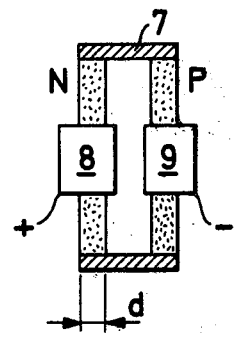
Fig. 1
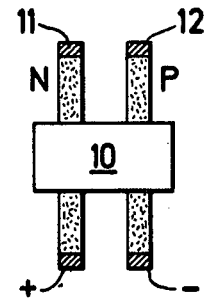
Fig. 2
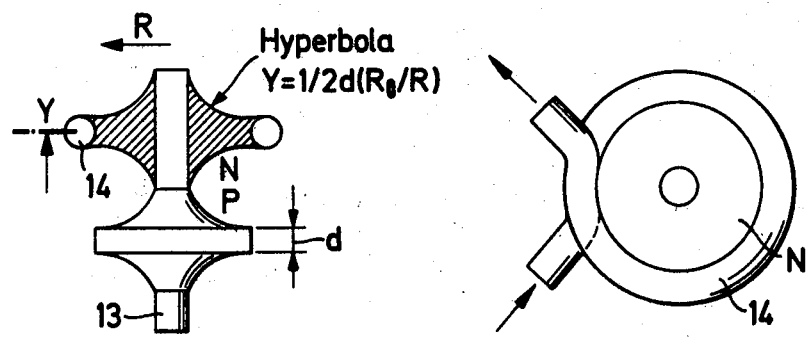
Fig. 3
Fig. 4
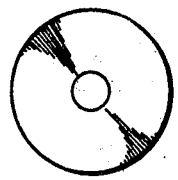
Fig. 5
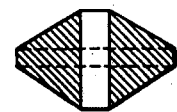
Fig. 6

THERMOELECTRIC ELEMENT

This invention relates to thermo-electric elements of the kind comprising two components of dissimilar thermo-electric material, for example, dissimilar conductors, semiconductors or intermetallic compounds, connected together usually by way of an intervening conductor to form a working junction. For descriptive convenience those two components are referred to simply as the dissimilar components hereinafter.

If an electric current is passed through the dissimilar components so as to flow from one to the other through the working junction the junction adopts a different temperature from that of the portions of the dissimilar components remote from it. The working junction temperature rises or falls depending upon the direction of current flow. Alternatively if the working junction is heated or cooled relative to the remote parts of the dissimilar components a potential differential is established across the element so that when the conductors are connected in a suitable circuit a current flow is established. The direction of the current flow depends upon whether the working junction is heated or cooled.

Such thermo-electric elements are well known and are commonly used on the one hand to heat or cool an external medium or to transfer heat from one medium to another, and on the other hand to produce electricity. Inasmuch as there must be a complete circuit for current flow there must always be at least one further or non-working junction when a thermo-electric element is put to use. Usually the non-working junction includes within it either the means for maintaining current flow or the electrical loads supplied by the element.

In practice the non-working junction is exposed to surroundings remote or isolated from those to which the working junction is exposed and each junction may be conditioned so as to readily dissipate heat or to absorb heat from its surroundings. It will be clear from the foregoing that thermo-electric elements may be operated in one of two modes. Furthermore elements which are efficient when operating in one mode are correspondingly efficient when operating in the other. Therefore for descriptive convenience the further description of the invention does not distinguish between the two modes of operation or type of element.

The invention relates more particularly to thermoelectric elements of the kind discussed above wherein each of the dissimilar components is in the form of an annulus or annular disc. Conveniently the annular components may be the same dimensionally and they may be mounted coaxially, either upon a central conducting rod or within an enclosing conducting cylinder. In the first mentioned arrangement the peripheries of the two components are encircled by circular electrodes, and in the second mentioned arrangement each of the annular components has a central metallic electrode. Thus in practice the currents flow radially through the two dissimilar components.

The objects, advantages and features of the invention will be more readily appreciated from the following detailed description in which:

FIG. 1 is a diagrammatic sectional view of a preferred embodiment of the thermoelectric element of this invention;

FIG. 2 is a sectional view similar to FIG. 1. of another thermoelectric element according to the invention;

FIG. 3 shows yet another embodiment of the present invention in partial section;

FIG. 4 is an end view of the thermoelectric element of FIG. 3;

FIG. 5 is an end view of an alternative embodiment of the element of FIG. 3; and FIG. 6 is a section view of the embodiment of FIG. 5.

FIGS. 1 and 2 annexed hereto are diagrammatic cross-sectional views of the above-mentioned, known kinds of annular type thermo-electric elements. In those Figures the annular disc dissimilar components are marked N and P respectively. The element illustrated by FIG. 1 comprises an outer conducting cylinder 7 constituting the working junction of element and central electrodes 8 and 9 whereby the element may be connected to an electrical power source. When electrode 8 is connected to the positive of the power source and electrode 9 to the negative as indicated in FIG. 1 then the direction of current flow relative to the dissimilar components N and P is such that electrode 7 is the hot junction of the thermo-electric element.

FIG. 2 illustrates the opposite arrangement wherein the working junction is a single central conducting rod 10 and the electrodes for connection to the current source are rings 11 and 12 rimming the peripheries of the dissimilar components N and P. With the polarities indicated in FIG. 2, 10 becomes the cold electrode of the element.

It will be seen that the dissimilar components of the elements of FIGS. 1 and 2 are in the form of annular discs of constant thickness with an inner diameter equal to the diameter of the electrodes 8 and 9 in FIG. 1 or the electrode 10 in FIG. 2 and with outer diameters equal to the inner diameters of the cylinder 7 or the rings 11 and 12.

The present invention has two aspects each being a modification of the simple annular disc arrangement illustrated in FIGS. 1 and 2.

The first characterisation of a thermo-electric element according to the invention resides in the selection of a particular ratio between the inner and outer diameters of the annular dissimilar components. If the outer and inner radii are designated $R_o$ and $R_i$ respectively then the first aspect of the invention requires the ratio of $R_o/R_i$ to be within the range of from four to five, with a preferred value of 4.5. At that value the maximum temperature difference between the hot and cold junction, in the absence of a thermal load, is obtained.

According to a second aspect of the invention the dissimilar components are not shaped as flat discs but rather are formed as circularly symmetrical bodies whose lateral sides are, or approximate to, hyperboloids of revolution. Such an arrangement is illustrated in FIGS. 3 and 4. FIG. 3 is a partly sectioned side elevation of a thermo-electric element according to the invention and FIG. 4 is an end view of the element of FIG. 3.

The element illustrated by FIGS. 3 and 4 comprises two dissimilar components N and P which apart from the ratio of their inner and outer diameters and apart from the shaping of their lateral surfaces are similar to the dissimilar components in FIG. 2. Thus they are mounted upon a single central rod-like electrode 13 which is the cold electrode and are rimmed by tubular circular electrodes such as 14 which are the hot electrodes. The electrodes 14 are tubular so that the cooling water may be circulated through them which water is then heated by the element when in operation.

As may be noted from FIGS. 3 and 4 the equation of each hyperbola is given by $y = \frac{1}{2} d (Ro)/R$ where $y$ is the distance from the median plane of the component, $R$ is the radial coordinate and $d$ the thickness of the component at its periphery. One axis of the hyperbola is the intersection of the median plane with the plane of the drawing and the other axis coincides with the axis of the component. The centre of the hyperbola is obliterated by the cold junction electrode of radius $Ro/4.5$.

In one particular example of thermo-electric element according to FIGS. 3 and 4 the diameter of the rod 13 may be 5.8 millimeters, the thickness D 3.6 millimeters and the outer diameter of each of the dissimilar components is 26 millimeters.

It is mentioned that both aspects of the invention independently give improved performance but it is desirable that they both be incorporated in elements according to the invention.

Several modifications of the most desirable configuration are possible which however do reduce the efficiency of the element to some extent. For example, the dissimilar components may have one flat side face and only one in the shape of a hyperboloid of revolution. Then, the hyperbola generating the second face is preferably in accordance with the equation $Y = D (Ro)/R$ where the symbols have the same meaning as before. Alternatively, but less desirably, only approximations to hyperboloids of revolution may be used even to approximations wherein the cross-sectional shape of the radial sectional shape is that of a truncated cone as illustrated in FIGS. 5 and 6 of the accompanying drawings.

For preference the thermo-electric material of the dissimilar components is isotropic or nearly isotropic and such material may be produced by well-known sintering processes.

In principle it does not matter whether the inner or outer electrode is used as the cold electrode.

However it may be shown that the efficiency of the elements is considerably higher when the inner electrode is the cold electrode.

I claim:

1. A thermo-electric element of the kind comprising two dissimilar annular components, inner and outer electrode means creating a working junction and permitting radial current flow in the dissimilar components wherein the ratio of the outer radius to the inner radius of each of the dissimilar components is within the range of from 4 to 5.

2. A thermo-electric element according to claim 1 wherein the ratio is substantially 4.5.

3. A thermo-electric element according to claim 1 wherein said electrode means comprise a central electrode extending axially through both of the dissimilar components and outer electrodes respectively rimming the dissimilar components.

4. A thermo-electric element of the kind comprising two annular dissimilar components, inner and outer electrode means constituting a working junction and permitting current flow radially in the dissimilar components wherein at least one lateral face of each of the dissimilar components is non-planar and approximates a hyperboloid of revolution.

5. A thermo-electric element according to claim 4 wherein the hyperbola generating said hyperboloid of revolution is defined by the equation $Y = \frac{1}{2}d (Ro)/R$ where $Y$ is the distance from the median plane of the components, $R$ is the radial co-ordinate and $d$ the thickness of the component at its periphery.

6. A thermo-electric element according to claim 4 wherein the ratio of the outer and inner radii of each element is within the range of 4 to 5.

* * * * *